(12) United States Patent
Carney et al.

(10) Patent No.: US 7,498,195 B2
(45) Date of Patent: Mar. 3, 2009

(54) MULTI-CHIP SEMICONDUCTOR CONNECTOR ASSEMBLY METHOD

(75) Inventors: Francis J. Carney, Gilbert, AZ (US);
Phillip Celaya, Gilbert, AZ (US);
Joseph K. Fauty, Mesa, AZ (US);
James P. Letterman, Mesa, AZ (US);
Stephen St. Germain, Scottsdale, AZ (US); Jay A. Yoder, Phoenix, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 131 days.

(21) Appl. No.: 11/673,942

(22) Filed: Feb. 12, 2007

(65) Prior Publication Data

US 2007/0126107 A1  Jun. 7, 2007

(51) Int. Cl.
*H01L 21/00* (2006.01)

(52) U.S. Cl. ............... 438/107; 438/111; 257/E21.615
(58) Field of Classification Search ................ 438/108, 438/109, 118, 119, 121, 123, 107, 111; 257/E21.615
See application file for complete search history.

(56) References Cited

U.S. PATENT DOCUMENTS

| | | | |
|---|---|---|---|
| 6,190,944 B1 * | 2/2001 | Choi | 438/109 |
| 6,303,981 B1 * | 10/2001 | Moden | 257/666 |
| 7,166,496 B1 * | 1/2007 | Lopez et al. | 438/110 |
| 2005/0224945 A1 * | 10/2005 | Saito et al. | 257/686 |

* cited by examiner

*Primary Examiner*—Alexander G Ghyka
*Assistant Examiner*—Seahvosh J Nikmanesh
(74) *Attorney, Agent, or Firm*—Robert P. Hightower

(57) ABSTRACT

In one exemplary embodiment, a multi-chip connector is formed to have a first conductive strip that is attached to a first semiconductor die and a second conductive strip that is attached to a second semiconductor die.

8 Claims, 7 Drawing Sheets

US 7,498,195 B2

MULTI-CHIP SEMICONDUCTOR CONNECTOR ASSEMBLY METHOD

CROSS-REFERENCE TO RELATED APPLICATIONS

The present application is based on prior U.S. application Ser. No. 10/877,165, now U.S. Pat. No. 7,202,105, filed on 28 Jun. 2004, which is hereby incorporated herein by reference, and priority thereto for common subject matter is hereby claimed. Additionally, this application is related to an application entitled "Multi-Chip Semiconductor Connector and Method" that has a U.S. patent application Ser. No. of 10/877,327, now U.S. Pat. No. 7,202,106, having inventors Carney et al and filed concurrently herewith and hereby incorporated herein by reference, and also related to an application entitled "Multi-Chip Semiconductor Connector Assemblies" that has a U.S. patent application Ser. No. of 10/877,325, having inventors Carney et al, both of which are filed concurrently herewith and also hereby incorporated herein by reference.

BACKGROUND OF THE INVENTION

The present invention relates, in general, to electronics, and more particularly, to methods of forming semiconductor devices and packaging therefor.

In the past, the semiconductor industry utilized a variety of package configurations to increase the packing density of semiconductor die in a system. The increased demand for electronic devices increased the demand for smaller, lighter, and yet more functional semiconductor devices and resulted in a demand for semiconductor packages that had increased semiconductor packaging densities with smaller outlines and mounting footprints. In some embodiments, semiconductor die were vertically stack on top of one another with an interposing layer of adhesive to attached to the semiconductor die in order to attach the die together. The die were then attached to a glass-epoxy type printed circuit board substrate or other similar substrate. The semiconductor die were then wire bonded to the substrate to form electrical interconnections between the substrate and the semiconductor die. One example of such a package configuration is disclosed in U.S. Pat. No. 6,650,019 issued to Thomas B. Glenn et al on Nov. 18, 2003.

It often took considerable horizontal space to wire bond to both of the semiconductor die which increased the footprint. Further, wire bonding to the semiconductor die consumed additional vertical space which increased the height. Another problem with such a configuration was thermal dissipation. The attachment medium used to attach the two die together often had low thermal conductivity, which reduced the thermal conductivity of the configuration and minimized the power dissipation capability of the configuration.

Accordingly, it is desirable to have a means of attaching multiple die together that provides high thermal conductivity, that does not require wire bonding, and that has a small footprint.

BRIEF DESCRIPTION OF THE DRAWINGS

For simplicity and clarity of illustration, elements in the figures are not necessarily to scale, and the same reference numbers in different figures denote the same elements. Additionally, descriptions and details of well-known steps and elements are omitted for simplicity of the description.

DETAILED DESCRIPTION OF THE DRAWINGS

Figure 1:
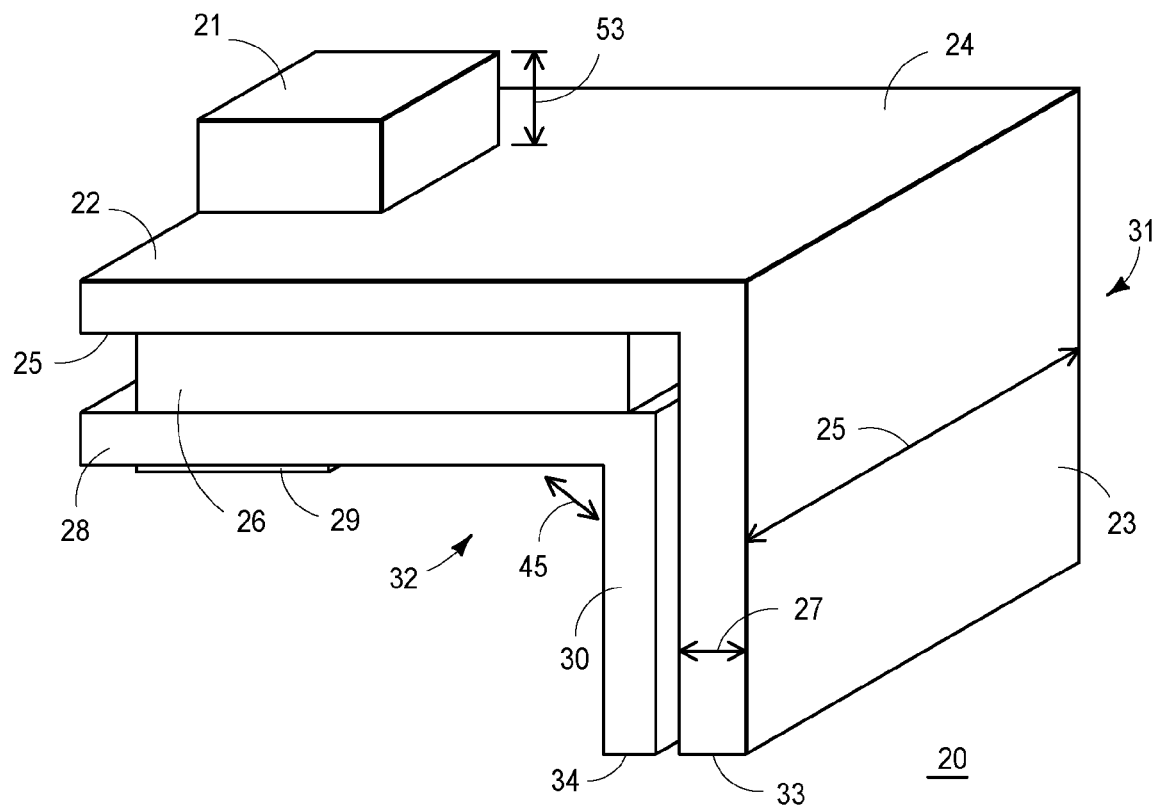
FIG. 1 schematically illustrates a highly enlarged isometric view of a portion of an embodiment of a multi-chip semiconductor connector in accordance with the present invention.

FIG. 1 schematically illustrates a highly enlarged portion of an embodiment of a multi-chip semiconductor connector 20 that may be utilized to attach together a plurality of semiconductor die. Connector 20 includes a first conductive strip 31 that includes a connection portion 22, a support portion 23, and a semiconductor die attachment area or attachment area 21. A second conductive strip 32 of connector 20 has a support portion 30, a connection portion 28, and a semiconductor die attachment area or attachment area 29. Strips 31 and 32 are identified in a general manner by arrows. An insulator 26 is positioned between first conductive strip 31 and second conductive strip 32 to provide electrical isolation therebetween and mechanical support therefor.

Figure 2:
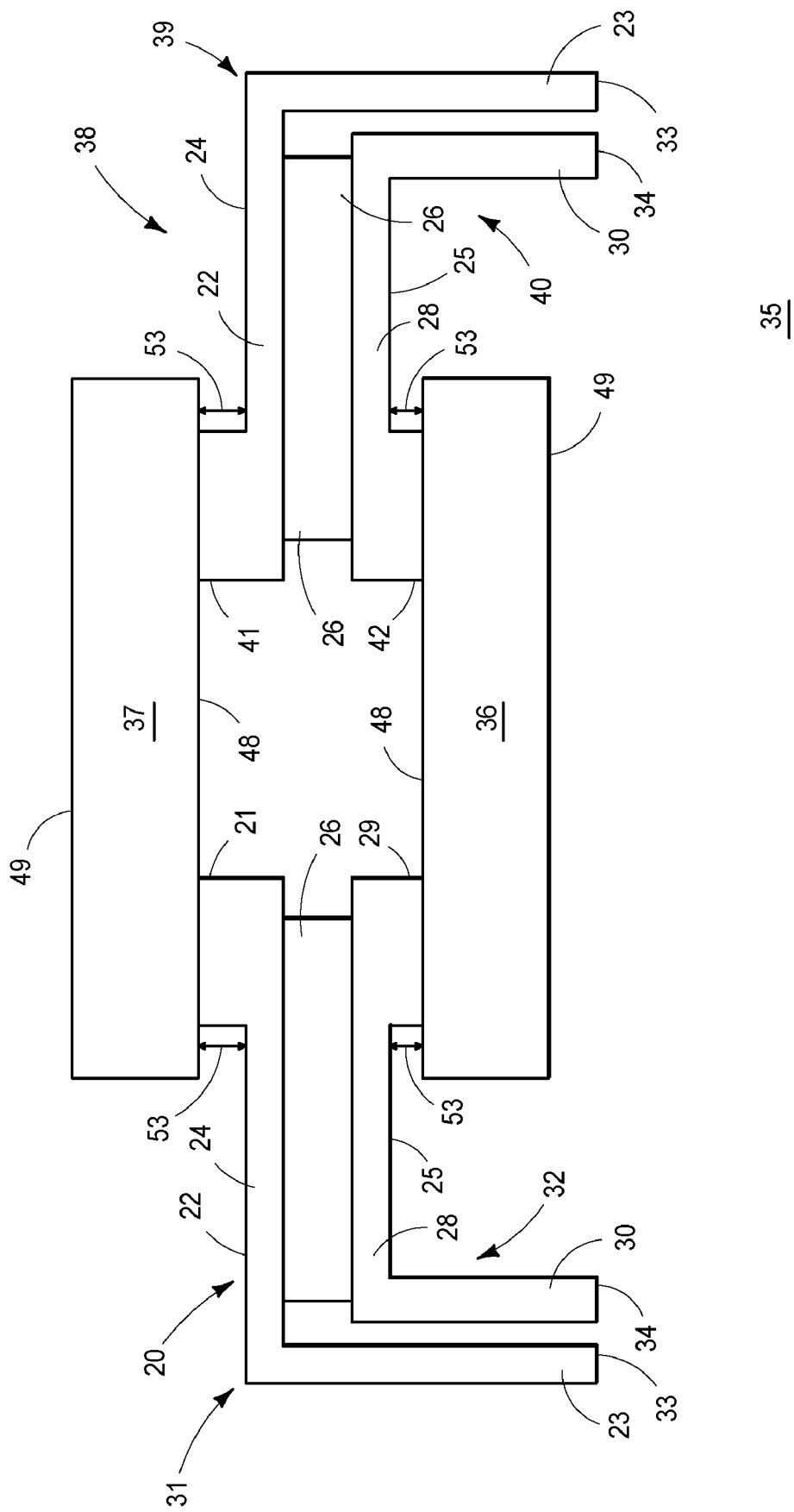
FIG. 2 schematically illustrates an enlarged cross-sectional portion of an embodiment of a multi-chip semiconductor connector assembly that utilizes the multi-chip semiconductor connector from FIG. 1 in accordance with the present invention.

FIG. 2 schematically illustrates an enlarged cross-sectional portion of an embodiment of a multi-chip semiconductor connector assembly 35 that utilizes connector 20 from FIG. 1 as one connector of a plurality of multi-chip semiconductor connectors to attach a first semiconductor die 36 to a second semiconductor die 37. This description has references to both FIG. 1 and FIG. 2. Assembly 35 also includes a second multi-chip semiconductor connector 38 that is an alternate embodiment of connector 20 that was explained in the description of FIG. 1. Connector 38 includes a first conductive strip 39 that has support portion 23, connection portion 22, and a first attachment area 41. A second conductive strip 40 of connector 38 has support portion 30, connection portion 28, and a second attachment area 42. Connector 38 and strips 39 and 40 are identified in a general way by arrows. Various embodiments of connectors 20 and 38, and methods for forming connectors 20 and 38 are disclosed in a related patent application previously incorporated herein by reference entitled "Multi-Chip Semiconductor Connector and Method" having inventors Carney et al.

Semiconductor die 36 and 37 typically have a top side or front side 48 that has a plurality of connection points and a bottom or backside 49 that typically has a single connection point. Such backside and front side connection points and electrodes and methods of forming them are well known to those skilled in the art. For example, die 36 and 37 may be power transistors that have a source and gate connection point on front side 48 and a drain connection point on backside 49. One or both of die 36 and 37 may also be a diode, an IGBT, an analog or a digital logic semiconductor device, or any other type of semiconductor device. The different connection points on each of die 36 and 37 may have different sized attachment pads or connection points, thus, the attachment area of connectors 20 and 38 may have different sizes or surface areas in order to mate to the corresponding connection points on die 36 and 37. For example, a source pad or source connection point may have a larger surface area than a gate pad or gate connection point in order to support a larger current flow, and a drain pad or drain connection point may have an even larger area than the source connection point. Consequently, attachment areas 41 and 42 of connector 38 are formed to have a larger surface area than attachment areas 21 and 29 in order to mate to the respective connection points of die 36 and 37. Connectors 20 and 38 mechanically attach die 36 to die 37 in different planes. As can be seen, at least the surface of front side 48 of die 37 is in a different plane from the surface of front side 48 of die 36. Typically, the two planes do not intersect. The plane of die 36 generally is substantially parallel to the plane of die 37, although they do not have to be parallel.

In order to form electrical connection to the connection points of die 36 and 37, strips 31, 32, 39, and 40 typically are formed from a conductive material that is suitable for being attached to the connection pads of die 36 and 37 using a suitable attachment medium, such as solder or conductive epoxy, and that provides a low resistance electrical conduction path. Attachment areas 21, 29, 41, and 42 typically are formed as raised areas on a portion of the surface of support portions 22 and 28. Areas 21 and 41, and areas 29 and 42 extend a first distance 53 from a surface of respective portions 22 and 28, for example extending from surface 24 of portion 22. First distance 53 typically is selected to be approximately no less than the bond-line thickness of the attachment material that is utilized to attach areas 21 and 41 to die 37 and areas 29 and 42 to die 36. Attachment areas 21, 29, 41, and 42 can be formed by a variety of methods and may be the same material as that of strips 31 and 32, or may be solder, or may be ball-bonds, or may be conductive epoxy. A distal end 33 of strips 31 and 39 and a distal end 34 of strips 32 and 40 generally are used to attach assembly 35 to an intermediate substrate such as a printed circuit board or a ceramic substrate or a semiconductor device leadframe, or may be used as an assembly that is encapsulated to form a semiconductor package. Insulator 26 provides electrical insulation between strips 31 and 32 and between strips 39 and 40 and also provides sufficient rigidity to support at least the weight of die 37. Although each of strips 31 and 32 are illustrated to have connection portions extending from only one side, it will be appreciated that any of strips 31 and 32 may have connection portions extending from all four sides of support portions 22 and 28, or extending from only one side, or extending from any combination of sides.

Figure 3:
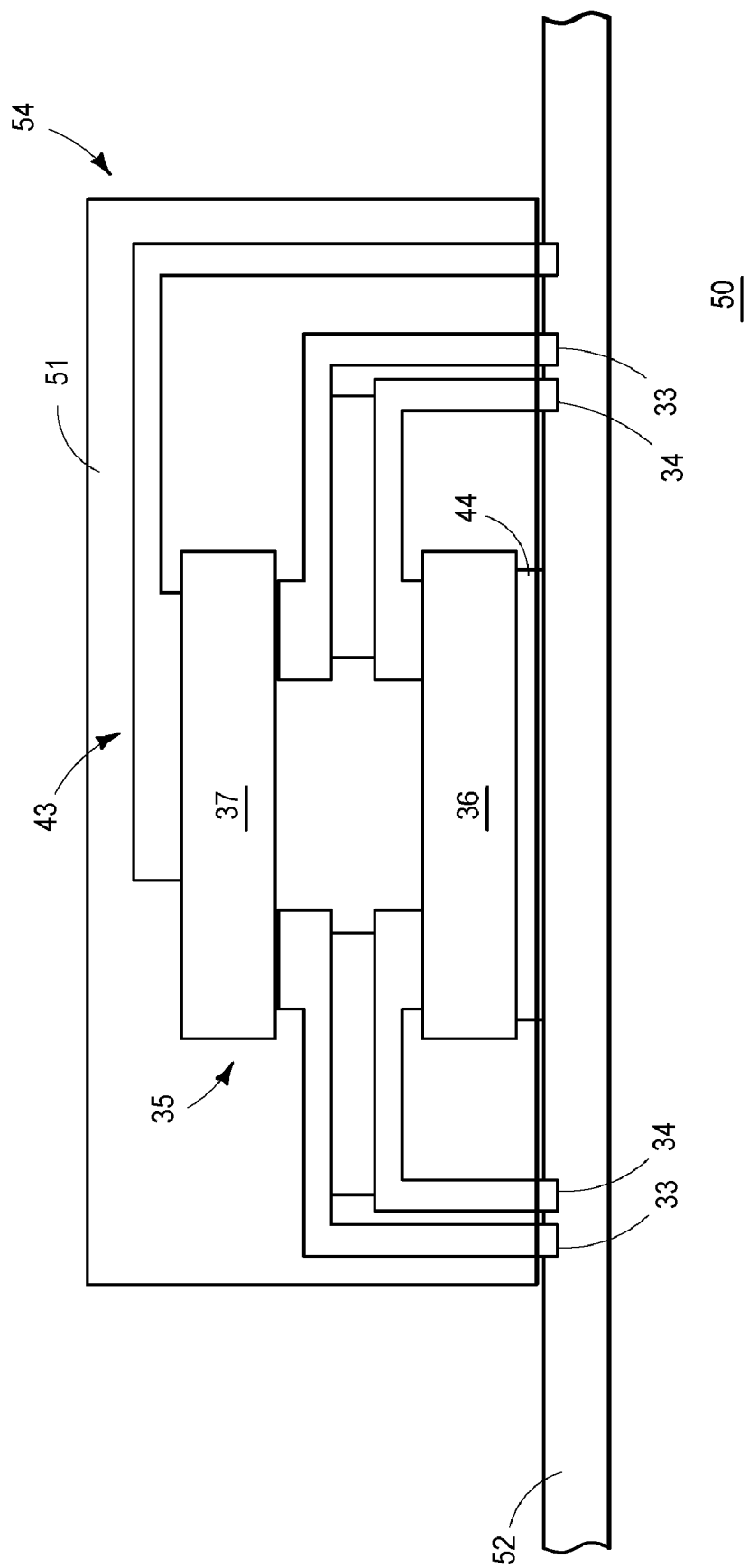
FIG. 3 schematically illustrates an enlarged cross-sectional portion of an embodiment of a semiconductor device that utilizes the multi-chip assembly from FIG. 2 in accordance with the present invention.

FIG. 3 schematically illustrates an enlarged cross-sectional portion of an embodiment of a semiconductor device 50 that utilizes assembly 35 within a semiconductor package 54 having a package body 51. Package 54 is illustrated in a general way by an arrow.

Figure 4:
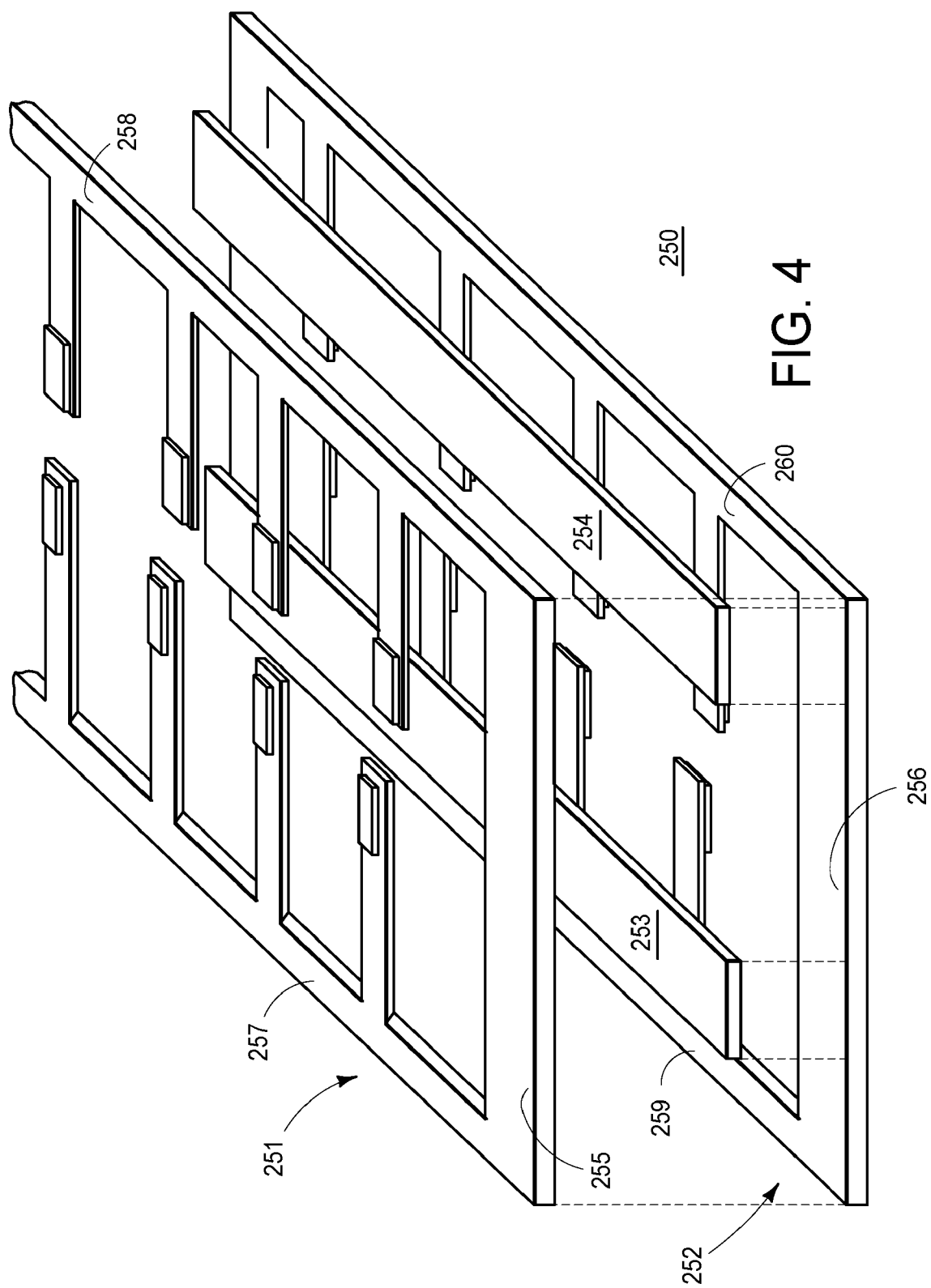
FIG. 4 schematically illustrates an enlarged exploded isometric view of a portion of an embodiment of a multi-chip semiconductor connector leadframe assembly in accordance with the present invention.

FIG. 4 schematically illustrates an enlarged exploded isometric portion of an embodiment of a leadframe assembly 250 according to a method for forming assembly 35. This description has references to FIG. 1 through FIG. 4. Leadframe assembly 250 includes a first leadframe panel 251, a second leadframe panel 252, and a plurality of insulator strips including a first insulator strip 253 and a second insulator strip 254. Leadframe panel 251 includes a main panel section 255 and a plurality of leadframe strips including a first leadframe strip 257 and a second leadframe strip 258. Similarly, leadframe panel 252 includes a main panel section 256 and a plurality of leadframe strips including a third leadframe strip 259 and a fourth leadframe strip 260. As is well known in the art, panels 251 and 252 generally have alignment holes or marks (not shown) that are used for aligning panels 251 and 252.

In a first exemplary embodiment of a method of forming assembly 35, leadframe panels 251 and 252 are mechanically attached to and electrically connected to a respective first plurality of die and second plurality of die prior to forming panels 251 and 252 into assembly 250. Solder having a first melting temperature is applied onto the connection points of the first plurality of die, such as a plurality of die 37, and onto the connection points of the second plurality of die, such as a plurality of die 36. For example, the surface of the first and second plurality of die may be flooded with solder so that the solder wets to the connection points when heated or the solder may be screen printed onto the connection points. Subsequently, attachment areas 21 and 41 of panel 251 are positioned onto the connection points of the first plurality of die and attachment areas 29 and 42 of panel 252 are positioned onto the respective connection points of the second plurality of die. Panels 251 and 252 may be manually positioned onto the first and second plurality of die or automated pick-and-place equipment can be used to place panels 251 and 252 onto the plurality of die. One example of an automated pick-and-place machine that is suitable for positioning connectors 20 and 38 is a Universal GSM Platform manufactured by Universal Instruments of Binghamton N.Y., a subsidiary of Dover Corporation. The solder is then activated to attach the first and second plurality of die to panels 251 and 252. For example, the solder can be reflowed to perform the activation.

Panels 251 and 252 with the respective first and second plurality of die attached thereto are then formed into assembly 250. Insulator strips 253 and 254 can be attached to one of panels 251 or 252. Strips 253 and 254 can be a variety of materials including KAPTON tape, polyimide, BT resin, epoxy, fiberglass-epoxy, ceramic, and an oxide layer. KAPTON is a registered trademark of E. I. Du Pont De Nemours Inc., of 1007 Market St. Wilmington Del. The KAPTON tape generally has one side that has an adhesive attached thereto. The adhesive side is attached to one of panels 251 or 252. A second adhesive is applied to the other side of the tape. One suitable adhesive for applying onto the KAPTON tape is commonly referred to as Elephane FC manufactured by Tomoegawa, Inc. of Wheeling, Ill., a wholy owned subsidary of Tomoegawa Paper Company, Ltd. of Tokoyo Japan. Such adhesives and methods of applying them are well known in the art. The other panel is then positioned onto the second adhesive to form leadframe assembly 250. Subsequently, individual assemblies 35 may be singulated from leadframe assembly 250 or the assembly and die attached thereto may be used to form semiconductor packages as will be seen hereinafter.

In a second example of an embodiment of a method of forming assembly 35 and device 50, solder having the first melting temperature is applied onto the connection points of the first plurality of die, such as plurality of die 37. Thereafter, leadframe assembly 250 is place onto the first plurality of die so that attachment areas 21 and 41 of respective connectors 20 and 38 are positioned on the connection pads of the first plurality of die. Assembly 250 may be positioned onto the first plurality of die or by manual or automated methods. Subsequently, the second plurality of die, such as plurality of die 36, may be positioned onto assembly 250 so that the connection points of the second plurality of die are aligned with attachment areas 29 and 42 of respective connectors 20 and 38. The solder can be reflowed to activate the attachment medium and attach the first and second plurality of die to leadframe assembly 250.

Alternately, the backside connection point of the second plurality of die can be attached to die attach areas or flags 44 of a semiconductor package leadframe. Such die attach flags, leadframes, and methods of attaching die thereto are well known in the art. Thereafter, solder having the first melting temperature is applied onto the connection points of the second plurality of die. The second plurality of die with the semiconductor package leadframe attached thereto are then positioned onto leadframe assembly 250 so that the connection points of the second plurality of die are aligned with attachment areas 29 and 42 of respective connectors 20 and 38. Typically, the second plurality of die are positioned onto assembly 250 by manipulating the semiconductor package leadframe to which the second plurality of die are attached. The attachment medium can then be activated to attach the first and second plurality of die to leadframe assembly 250. For example, the solder can be reflowed to perform the activation.

The surface area of each of attachment areas 21, 29, 41, and 42 generally is formed to be less than the surface area of the exposed part of the corresponding connection point of dies 36 and 37. As is well known in the art, a portion of the connection points on die 36 and 37 may be covered by a passivation layer, thus, the exposed surface area of the connection point may be less than the total surface area of the connection point. Forming the surface area of each of attachment areas 21, 29, 41, and 42 less that the corresponding connection point allows the surface tension of the solder to keep attachment areas 21, 29, 41, and 42 properly aligned during the attachment process. First distance 53 of connectors 20 and 38 is formed to ensure that the solder sufficiently wets to areas 21, 29, 41, and 42. Typically, distance 53 is formed to be no less than the thickness of the bond-line of the solder used for attaching connectors 20 and 38. Forming distance 53 to be approximately no less than the bond-line thickness assists in keeping solder off of the connection portions of connectors 20 and 38.

Alternately, the solder used as the attachment medium may be applied onto attachment areas 21, 29, 41, and 42 of panels 251 and 252 instead of onto the connection points of the plurality of die. The solder usually is applied prior to attaching panels 251 and 252 together to form assembly 250. The solder may be applied by selectively masking off areas 21, 29, 41, and 42 and leaving the desired position for areas 21, 29, 41, and 42 exposed for attaching the solder. Panels 251 and 252 may be dipped into molten solder to form the attachment medium or the solder may be screen printed onto areas 21, 29, 41, and 42.

Alternately, connectors 20 and 38 may be singulated from leadframe assembly 250 prior to attaching connectors 20 and 38 to the first and second plurality of die. Thus, singulated connectors 20 and 38 are individually attached to die 36 and 37.

In another embodiment of a method of forming assembly 35, panels 251 and 252 may be attached to the first and second plurality of die by conductive epoxy. The conductive epoxy can be screen-printed onto the connection points of the plurality of die and subsequently partially curred (commonly referred to as a B-stage epoxy). Then the first plurality of die are positioned onto attachment areas 21 and 41 of panel 251 followed by positioning the second plurality of die onto attachments areas 29 and 42 of panel 252. The positioning of the first and second plurality of die can be accomplished by the same manual or automated techniques described hereinbefore. The attachment medium can then be activated to attach the first and second plurality of die to leadframe assembly 250. For example, the conductive epoxy can be cured to mechanically attach and electrically connect the first and second plurality of die to connectors 20 and 38 of assembly 250. Alternately, the conductive epoxy may be applied onto areas 21, 29, 41, and 42 instead of onto the plurality of die.

Referring back to FIG. 3, a conductor 43 may be attached to backside 49 of die 37. Conductor 43 may be attached by similar techniques used to attach connectors 20 and 38. Conductor 43 may also be formed as a portion of a leadframe panel so that a plurality of conductors 43 are attached to the backside of the first plurality of die. Conductor 43 may be positioned on die 37 prior to heating assembly 35 so that conductor 43 is attached to die 37 at the same time as connectors 20 and 38. Alternately, conductor 43 may be positioned onto die 37 after attaching connector 20 and 38. In such a case, a solder having a second melting temperature that is less than the first melting temperature could be used to attach conductor 43.

Assembly 35 can subsequently be mounted directly onto a substrate such as a printed circuit board or a ceramic substrate, or may be used as an assembly that is encapsulated to form a semiconductor package. Assembly 35 typically is encapsulated to form a semiconductor package 54. Assembly 35 can be attached to a carrier tape 52 (FIG. 3) to handle assembly 35 during the process of forming package 54 and package body 51. As is well known in the art, carrier tapes generally have an adhesive on one surface that is utilized to adhere the carrier tape to semiconductor die and leadframes. The other surface of the carrier tape generally does not have an adhesive. Assembly 35 is positioned onto carrier tape 52 with distal ends 33 and 34 resting on the adhesive surface. Flag 44 and a distal end of conductor 43 typically may also rest on the adhesive surface of tape 52. Assembly 35 is then encapsulated to form package 54 and body 51. Assembly 35 and tape 52 may be placed into a mold cavity to mold body 51 or body 51 may be formed by dispensing an encapsulating material onto assembly 35. Because distal ends 33 and 34 are resting on tape 52, ends 33 and 34 are generally at least substantially coplanar with a bottom surface of body 51. In some embodiments, ends 33 and 34 may extend past the bottom surface of body 51. Alternately leadframe assembly 250 may be used to handle assembly 35 during the process of forming package 54.

The rigidly of strips 31, 32, 39, and 40 mechanically support die 36 and 37 and eliminate the need for an insulating material resting on the surfaces of die 36 and 37 or between die 36 and 37 to provide the mechanical support. The large surface area of strips 31, 32, 39, and 40 provides low resistance and high thermal conductivity thereby increasing the thermal capacity and reducing the lead resistance of package 54.

Figure 5:
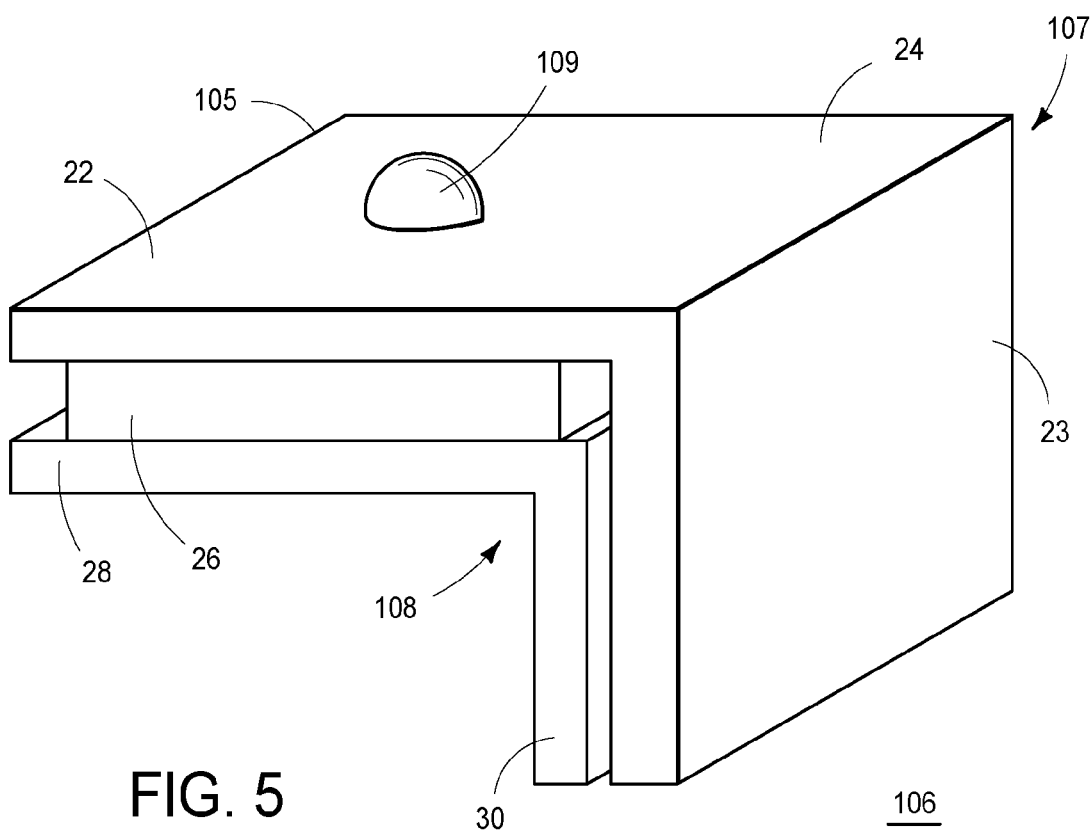
FIG. 5 schematically illustrates an enlarged isometric view of a multi-chip semiconductor connector that is an alternate embodiment of the multi-chip semiconductor connector of FIG. 1 in accordance with the present invention.

FIG. 5 schematically illustrates an enlarged isometric view of a multi-chip semiconductor connector 106 that is an alternate embodiment of connectors 20 and 38 explained in the description of FIG. 1 through FIG. 4. Connector 106 includes a first conductive strip 107 and a second conductive strip 108 that are alternate embodiments of respective strips 31 and 32 that were described in the description of FIG. 1 through FIG. 6. Strips 107 and 108 include attachment areas 109 that are positioned on surface 24 of portion 22 and on the second surface of portion 28. Attachment areas 109 are alternate embodiments of areas 21, 29, 41 and 42.

In a first embodiment of connector 106, attachment areas 109 are formed as ball-bonds attached to portions 22 and 28. Such ball-bonds and methods of forming them are well known in the art. This first embodiment of connector 106 may be attached to die 36 and 37 by the same methods described for attaching connectors 20 and 38 in the explanation of FIG. 1 through FIG. 4.

In another embodiment of connector 106, attachment areas 109 are formed as areas of solder having a second melting temperature that is attached to portions 22 and 28. The solder used for area 109 may be a solder ball that is positioned on portions 22 or 28 and reflowed to form area 109, or may be solder that is selectively applied to the attachment area by screen printing or by masking off a portion of connection portion 22 and 28 and dipping connector 106 into a solder pot. Connector 106 may be applied to die 36 and 37 using the same methods utilized for attaching connectors 20 and 38 and leadframe assembly 250, including soldering connector 106 to die 36 and 37. In such a soldering method of attachment, the first melting temperature of the solder applied to die 36 and 37 typically would be lower than the second melting temperature of areas 109.

Alternately, the solder of areas 109 may be used as the attachment medium instead of applying solder to the connection points of die 36 and 37. Such a method is described hereinbefore in the description of FIG. 3 and FIG. 4.

Figure 6:
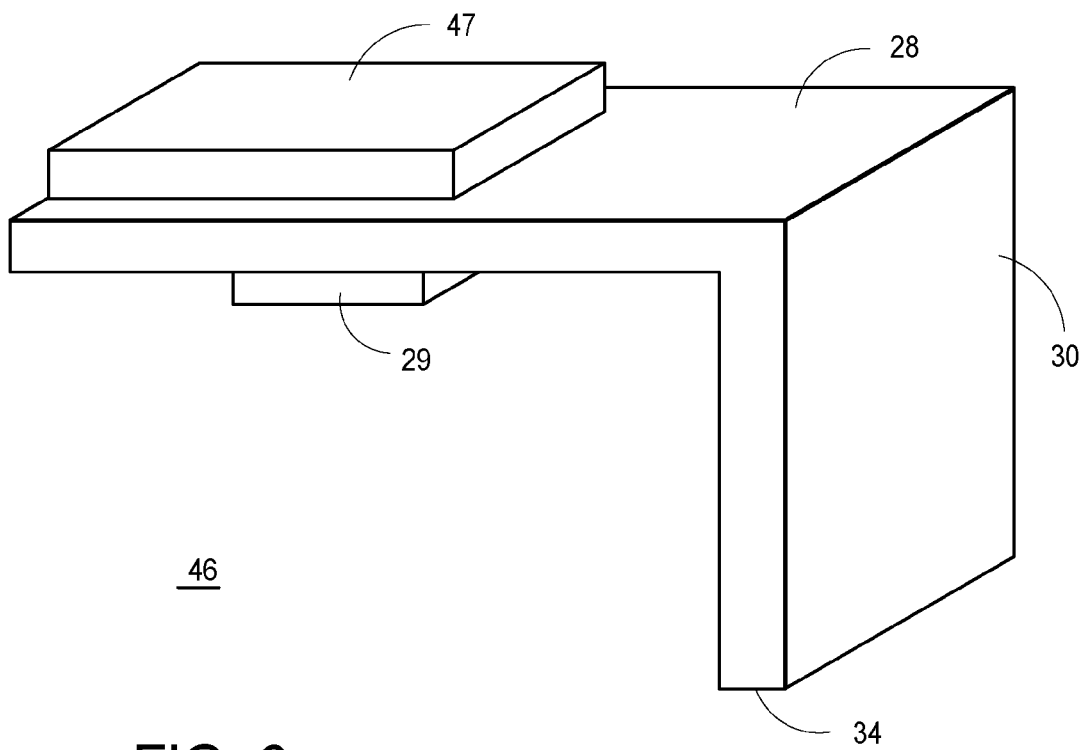
FIG. 6 schematically illustrates an enlarged isometric view of another multi-chip semiconductor connector that is an alternate embodiment of the multi-chip semiconductor connector of FIG. 1 and FIG. 5 in accordance with the present invention.

FIG. 6 schematically illustrates an enlarged cross-sectional portion of a multi-chip connector 46 that may be utilized to form a mechanical connection and a common electrical connection between connection points on two semiconductor die such as die 36 and die 37, instead of electrically isolated connections that were formed by connectors 20, 38, 100, and 106. For example, if die 36 and 37 are power MOS transistors, connector 46 may be utilized to form a common connection between a source of transistors on die 36 and a drain of transistors on die 37. Connector 46 is an alternate embodiment of conductive strip 32 and includes an attachment area 42 on a bottom surface of portion 28 and an attachment area 47 on a top surface of portion 28. Connector 46 is formed to provide electrical contact to a large surface area electrode, thus, the surface area of attachment area 47 is larger than the surface area of attachment area 29 in order to provide a low resistance connection between semiconductor die having different sized connection points. Alternately, areas 47 and 29 may have the same size in order to provide electrical connection between two connection points of the same size, for example two source connection points. Connector 46 may be formed and attached using techniques described hereinbefore.

Figure 7:
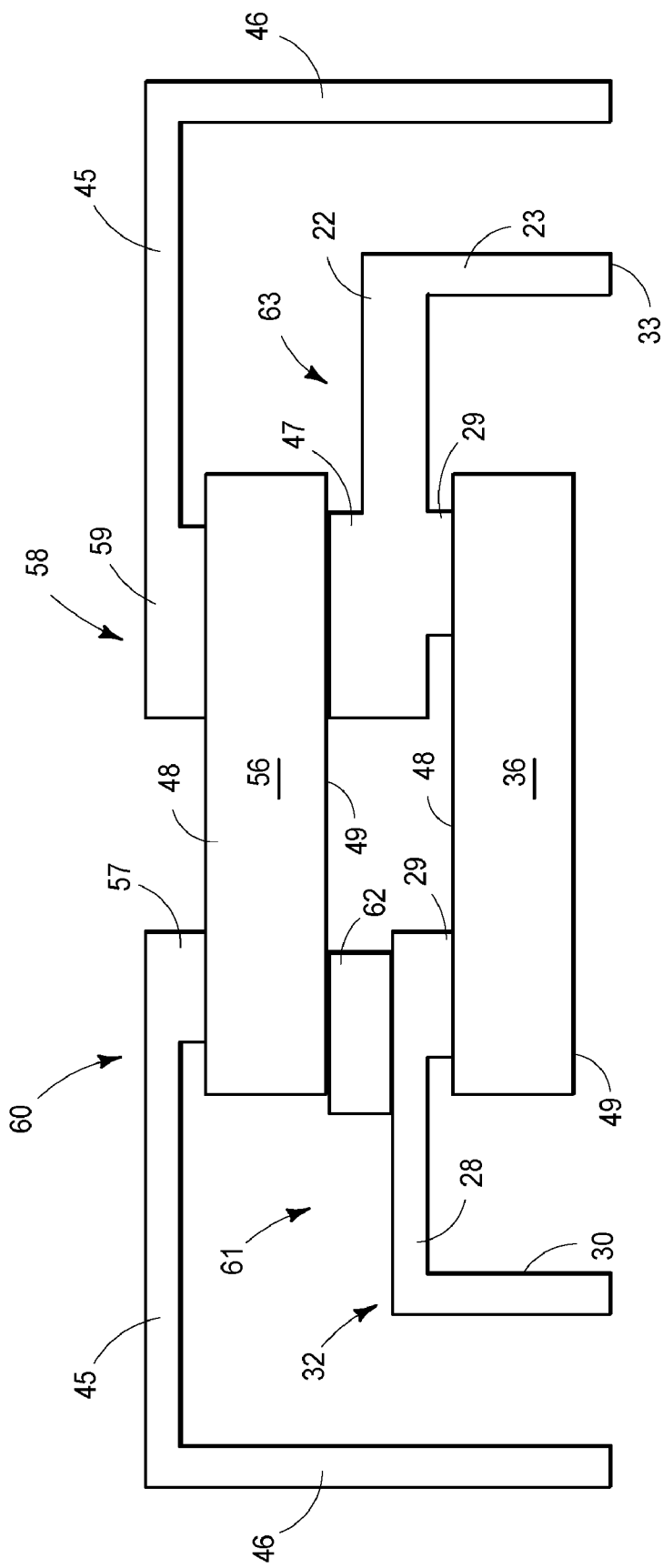
FIG. 7 schematically illustrates an enlarged cross-sectional portion of an embodiment of a multi-chip semiconductor connector assembly that utilizes the multi-chip semiconductor connector of FIG. 6 in accordance with the present invention.

FIG. 7 schematically illustrates an enlarged cross-sectional portion of a multi-chip semiconductor connector assembly 55 that is an alternate embodiment of assembly 35 that was explained in the description of FIG. 2 through FIG. 5. Assembly 55 includes a semiconductor die 56 that has a different orientation than die 37. Die 56 is oriented with backside 49 facing the same direction as backside 49 of die 36. For example, die 56 may have a high current carrying electrode, such as a drain of an MOS transistor, on backside 49, and a plurality of other electrodes on front side 48. Assembly 55 also includes a multi-chip semiconductor connector 63 and a multi-chip semiconductor connector 61 that are utilized to electrically and mechanically attach die 56 to die 36. Connector 63 is an alternate embodiment of connector 46 and provides a common electrical connection between the electrode on backside 49 of die 56 and an electrode of die 36, for example between a drain electrode of die 56 and a source electrode of die 36. Connector 61 is an alternate embodiment of connector 20. Connector 61 includes second conductive strip 32 and an insulator 62 on a surface of strip 32. Insulator 62 is similar to insulator 26, however, the thickness of insulator 62 generally is selected to ensure that die 56 is substantially coplanar to die 36.

Assembly 55 may be formed in a manner similar to those described for forming assembly 35. However, insulator 62 is attached to die 56 instead of to a conductive strip such as strip 31. In one embodiment, insulator 62 is Kapton tape. The Kapton tape generally has one side that has an adhesive attached thereto. The adhesive side of the Kapton tape is attached to strip 32. Thereafter, a second adhesive is applied to the other side of the tape. One suitable adhesive for applying to insulator 62 is commonly referred to as Elephane FC manufactured by Tomoegawa, Inc. of Wheeling, Ill., a wholly owned subsidary of Tomoegawa Paper Company, Ltd. of Tokoyo Japan. Such adhesives are well known in the art. Insulator 62 may be applied to die 56 prior to attaching connector 63 and die 36 to die 56, or insulator 62 may be applied to strip 32 prior to attaching strip 32 to die 36, or insulator 62 may be applied to strip 32 after attaching strip 32 to die 36. The second adhesive typically may be applied to insulator 62 prior to or after positioning strip 32 onto die 36. Assembly 55 may be formed similarly to assembly 35, thus, strip 32 and connector 63 may be formed as portions of a leadframe panel such as panel 251 explained in the description of FIG. 3 and FIG. 4. Alternately, insulator 62 may B-stage epoxy that is applied to strip 32 prior to positioning strip 32 onto die 36 or after such positioning. The B-stage epoxy would be activated subsequently to attaching die 36 and 56 to connector 63. Connector 63 can also be formed as a leadframe panel such as panel 251 to facilitate forming assembly 55.

Assembly 55 may also includes single conductors 58 and 60 that are alternate embodiments of conductor 43 illustrated in FIG. 2 and FIG. 43. Conductors 58 and 60 can also be formed as a leadframe panel, such as panel 251 and attached to die 56 as described hereinbefore.

Figure 8:
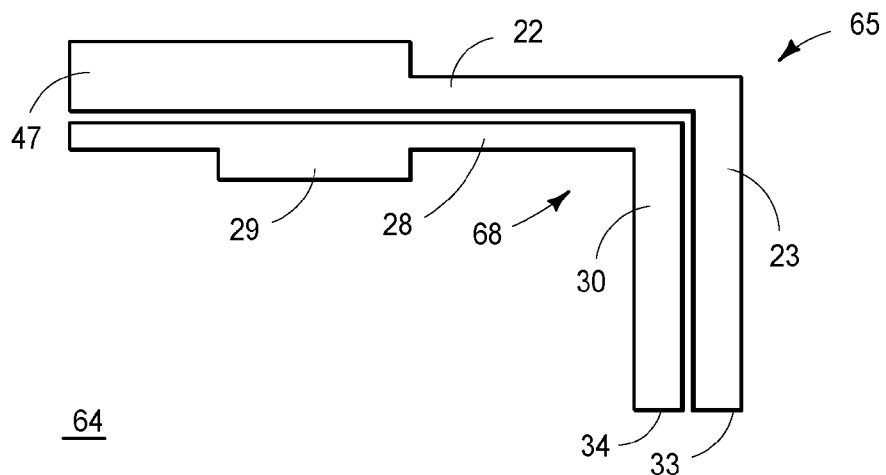
FIG. 8 schematically illustrates an enlarged cross-sectional view of another multi-chip connector that is an alternate embodiment of the multi-chip connector of FIG. 1, FIG. 5, and FIG. 6 in accordance with the present invention.

FIG. 8 schematically illustrates an enlarged cross-sectional portion of a multi-chip connector 64 that is an alternate embodiment of connector 63 that was explained in the description of FIG. 7. Connector 64 includes a first conductive strip 65 and a second conductive strip 68. Strips 65 and 68 are identified in a generally way by arrows. Strip 65 includes connection portion 22, support portion 23, and attachment area 47. Strip 68 includes connection portion 28, support portion 30, and attachment area 29. Strip 65 is mechanically and electrically attached to strip 68 in order to provide the desired electrical connection between the two connection points of two semiconductor die.

In one embodiment, strips 65 and 68 are formed as leadframe panel, such as panel 251. The two panels, including strips 65 and 68, are attached together by conductive epoxy to form strips 65 and 68 into connector 64. For this embodiment of connector 64, connector 64 can be attached to die 36 and 56 using the methods described for hereinbefore.

In another embodiment of forming assembly 55, strip 65 may be attached to strip 68 using solder reflow techniques. For example, strip 65 may be soldered to strip 68 prior to positioning connector 64 onto die 36. In this embodiment, connector 64 can be attached to die 36 and 56 using the multiple solder melting temperature method described in the description of FIG. 2. The solder used to attach strips 65 and 68 would have a higher melting temperature than the solder used to attach connector 64 to die 36 and 56.

Alternately, the same type of solder may be used to attach strips 65 and 68 and to attach connector 64 to semiconductor die 36 and 56. Solder is applied to die 36, die 56, and to the inner surface of one of strips 65 or 68. Strip 68 is positioned onto the connection point of die 36, strip 65 is positioned onto strip 68, and die 56 is positioned onto strip 65. The assembly is heated to reflow the solder and attach connector 64 to die 36 and 56. Strips 65 and 68 may also be formed as a leadframe assembly that is used to form assembly 55 using techniques similar to those describe for forming assembly 35.

Figure 9:
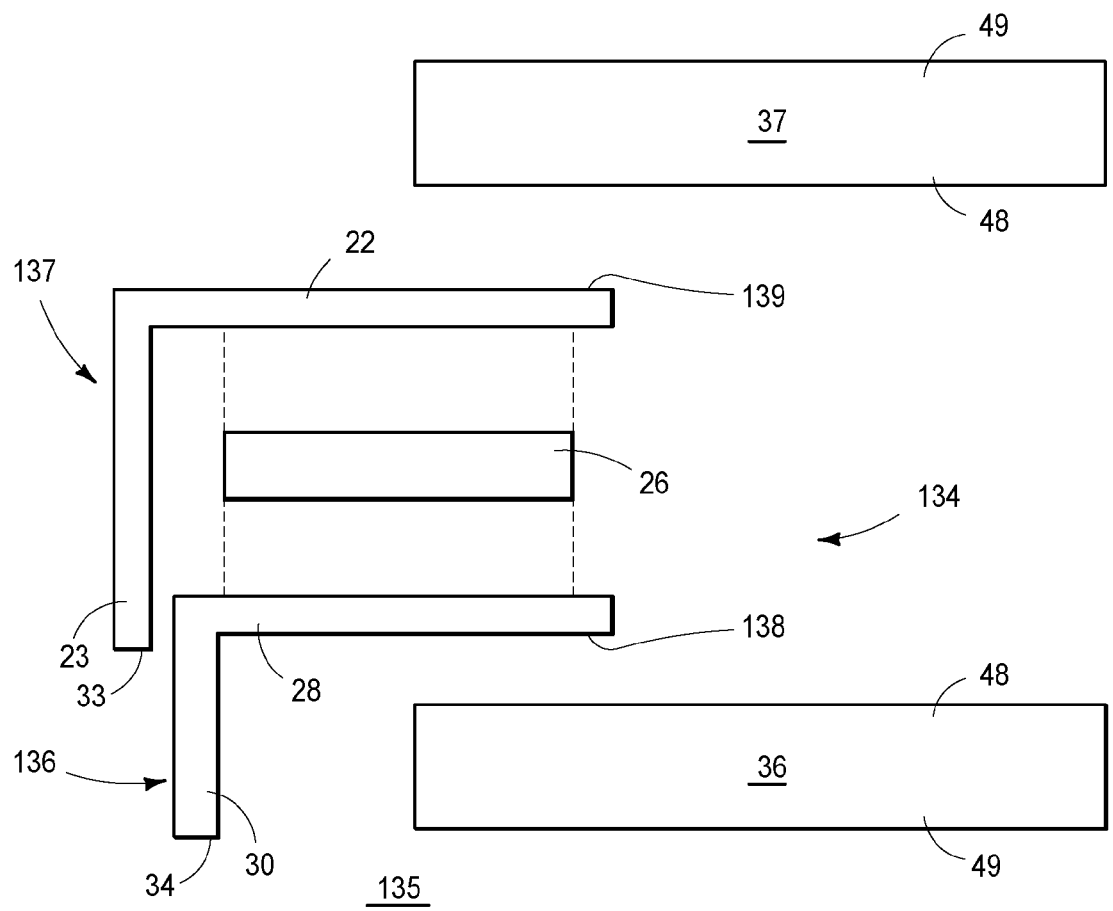
FIG. 9 schematically illustrates an enlarged isometric view of another multi-chip connector that is an alternate embodiment of the multi-chip connector of FIG. 1 in accordance with the present invention.

FIG. 9 schematically illustrates an enlarged cross-sectional exploded view of a multi-chip semiconductor connector assembly 135 that is an alternate embodiment of assembly 35 that was explained in the description of FIG. 2 through FIG. 4. Assembly 135 includes a multi-chip semiconductor connector 134 that is an alternate embodiment of connectors 20 and 38. Connector 134 includes a first conductive strip 136 and a second conductive strip 137 that are alternate embodiments of respective conductive strips 31 and 32. Connector 134, strip 136, and strip 137 are identified in a general way by arrows. Connector 134 is electrically connected to and mechanically attached to die 36 and 37 by thermo-compression bonding techniques. Strip 136 has an attachment area 138 and strip 137 has an attachment area 139. Areas 138 and 139 are areas on the surface of respective strips 136 and 137 where strips 136 and 137 are attached to the connections points of die 36 and 37.

In one embodiment of a method of forming assembly 135, a plurality of strips 136 is formed as a first leadframe panel, such as panel 251. Areas 138 of the plurality of strips 136 are thermo-compression bonded to a plurality of die 36. Similarly, a plurality of strips 137 is formed as a second leadframe panel. Areas 139 of the plurality of strips 137 are thermo-compression bonded to a plurality of die 37. The adhesive side of insulator 26 is attached to portion 28 of strips 136. A second adhesive is applied to the other side of insulator 26, and portion 22 of strips 137 is positioned onto the second adhesive to electrically connect and mechanically attach connectors 134 to die 36 and 37. Such thermo-compression bonding techniques are well known in the art. Assembly can be used in the same manner as assembly 35.

In another embodiment of a method of forming assembly 135, strips 31 and 32 are thermo-compression bonded to die 36 and 37 instead of strips 136 and 137. Insulator 26 is attached in a manner similar to that used for connector 134.

In view of all of the above, it is evident that a novel device and method is disclosed. Included, among other features, is forming a multi-chip semiconductor assembly by electrically connecting and mechanically attaching a multi-chip semiconductor connector to a plurality of semiconductor die. The rigidity of the multi-chip semiconductor connector provides support for the die and eliminates the need for an intermediate adhesive support layer thereby improving the thermal dissipation of the assembly and packages that use the assembly. Using the connectors to provide electrical connection between the semiconductor die and a semiconductor package reduces the package height and footprint. Additionally, more than two semiconductor die can be attached together to increase the packing density of the packages and any system that uses the packages.

The invention claimed is:

1. A method of forming a multi-chip semiconductor connector assembly comprising:

providing a vertical current flow semiconductor device formed on a first semiconductor die, the first vertical current flow semiconductor device having a first connection point on a first surface of the first semiconductor die and a second connection point on a second surface of the first semiconductor die wherein the first surface of the first semiconductor die is opposite to the second surface of the first semiconductor die;

providing a second vertical current flow semiconductor device formed on a second semiconductor die, the second vertical current flow semiconductor device having a first connection point on a first surface of the second semiconductor die and a second connection point on a second surface of the second semiconductor die wherein the first surface of the second semiconductor die is opposite to the second surface of the second semiconductor die;

attaching mechanically and connecting electrically a first attachment area on a first surface of a first conductive strip to the first connection point on the first surface of the first semiconductor die without wire-bonding the first semiconductor die to the first conductive strip; and attaching a second attachment area on a second surface of the first conductive strip to the first connection point on the first surface of the second semiconductor die wherein the first semiconductor die is in a first plane and the second semiconductor die is in a second plane that is different than the first plane.

2. The method of claim 1 wherein attaching mechanically and connecting electrically the first attachment area on the first surface of the first conductive strip to the first connection point on the first surface of the first semiconductor die includes attaching the first attachment area to one of a source connection point, a gate connection point, or a drain connection point of a first vertical current flow transistor and wherein attaching the second attachment area on the second surface of the first conductive strip to the first connection point on the first surface of the second semiconductor die includes attaching the second attachment area to one of a source connection point, a gate connection point, or a drain connection point of a second vertical current flow transistor.

3. The method of claim 1 wherein attaching the second attachment area on the second surface of the first conductive strip to the first connection point on the first surface of the second semiconductor die includes attaching the second attachment area that has a first portion overlying a first portion of the first attachment area.

4. The method of claim 1 wherein attaching mechanically and connecting electrically the first attachment area on the first surface of the first conductive strip to the first connection point on the first surface of the first semiconductor die includes attaching the first attachment area to the first connection point by a method selected from the group of soldering or using conductive epoxy or thermo-compression bonding.

5. The method of claim 1 further including connecting the first conductive strip to a first lead of a semiconductor package leadframe.

6. The method of claim 1 wherein attaching mechanically and connecting electrically the first attachment area on the first surface of the first conductive strip to the first connection point includes forming a distal end of the first conductive strip as a terminal of a semiconductor package.

7. A method of forming a multi-chip semiconductor connector assembly comprising:
 providing a vertical current flow semiconductor device formed on a first semiconductor die, the first vertical current flow semiconductor device having a first connection point on a first surface of the first semiconductor die and a second connection point on a second surface of the first semiconductor die wherein the first surface of the first semiconductor die is opposite to the second surface of the first semiconductor die;
 providing a second vertical current flow semiconductor device formed on a second semiconductor die, the second vertical current flow semiconductor device having a first connection point on a first surface of the second semiconductor die and a second connection point on a second surface of the second semiconductor die wherein the first surface of the second semiconductor die is opposite to the second surface of the second semiconductor die;
 attaching mechanically and connecting electrically through one common connection point a first attachment area on a first surface of a first conductive strip to the first connection point on the first surface of the first semiconductor die;
 attaching mechanically and connecting electrically a first attachment area on a first surface of a second conductive strip to the first connection point on the first surface of the second semiconductor die; and
 attaching the first conductive strip to the second conductive strip.

8. The method of claim 7 wherein attaching mechanically and connecting electrically the first attachment area on the first surface of the first conductive strip to the first connection point on the first surface of the first semiconductor die includes attaching the first attachment area to one of a source connection point, a gate connection point, or a drain connection point of a first vertical current flow transistor; and
 wherein attaching mechanically and connecting electrically the second attachment area on the second surface of the first conductive strip to the first connection point on the first surface of the second semiconductor die includes attaching the second attachment area to one of a source connection point, a gate connection point, or a drain connection point of a second vertical current flow transistor.

* * * * *

UNITED STATES PATENT AND TRADEMARK OFFICE
CERTIFICATE OF CORRECTION

PATENT NO.        : 7,498,195 B2
APPLICATION NO.   : 11/673942
DATED             : March 3, 2009
INVENTOR(S)       : Francis J. Carney et al.

Page 1 of 1

It is certified that error appears in the above-identified patent and that said Letters Patent is hereby corrected as shown below:

On the Title Page, please insert the following priority information that was omitted:
Item (62) --Related U.S. Application Data
(62) Divisional of application No. 10/877165 filed on June 28, 2004 now Pat. No. 7,202,105--

On the Title Page, in item (74), please correct the middle initial of the attorney as shown below:
Robert [P.] --F.-- Hightower.

Signed and Sealed this

Twenty-fourth Day of November, 2009

David J. Kappos
*Director of the United States Patent and Trademark Office*